US012660619B2

(12) United States Patent
Lu

(10) Patent No.: US 12,660,619 B2
(45) Date of Patent: Jun. 16, 2026

(54) SEMICONDUCTOR DEVICE STRUCTURE WITH EFFICIENT HEAT-REMOVAL STRUCTURES ACROSS THE CHIP AND MONOLITHIC FABRICATION METHOD THEREFOR

(71) Applicant: Invention and Collaboration Laboratory, Inc., Taipei City (TW)

(72) Inventor: Chao-Chun Lu, Hsinchu (TW)

(73) Assignee: INVENTION AND COLLABORATION LABORATORY, INC., Taipei City (TW)

( * ) Notice: Subject to any disclaimer, the term of this patent is extended or adjusted under 35 U.S.C. 154(b) by 0 days.

(21) Appl. No.: 19/308,943

(22) Filed: Aug. 25, 2025

(65) Prior Publication Data

US 2025/0391730 A1    Dec. 25, 2025

Related U.S. Application Data

(63) Continuation of application No. 18/533,720, filed on Dec. 8, 2023.

(Continued)

(51) Int. Cl.
H10W 40/22       (2026.01)
H10D 84/40       (2025.01)
H10W 40/25       (2026.01)

(52) U.S. Cl.
CPC ............ H10W 40/22 (2026.01); H10D 84/40 (2025.01); H10W 40/226 (2026.01); H10W 40/258 (2026.01)

(58) Field of Classification Search
CPC .................................................. H01L 23/3675
See application file for complete search history.

(56) References Cited

U.S. PATENT DOCUMENTS 7,012,007 B1    3/2006  Goo et al.
8,912,574 B2 *  12/2014  Dahlstrom ........... H10D 10/021
                                                            257/E29.171
(Continued)

FOREIGN PATENT DOCUMENTS

JP    2006-156664 A    6/2006
JP    2012-182336 A    9/2012
TW      202243011 A    11/2022

OTHER PUBLICATIONS

Extended European Search Report for European Application No. 24206032.5, dated Jun. 4, 2025.

(Continued)

*Primary Examiner* — William A Harriston
(74) *Attorney, Agent, or Firm* — Birch, Stewart, Kolasch & Birch, LLP

(57) ABSTRACT
The present invention discloses a device structure including heat removal structure (such as high thermal conductivity column and/or plate within the semiconductor substrate) to enhance heat dissipation. The device structure comprises a semiconductor substrate with an original semiconductor surface; a circuit element located within a semiconductor body region of the semiconductor substrate; and a vertical heat dissipation column in the semiconductor substrate and surrounding the semiconductor body region. Wherein the vertical heat dissipation column comprises a thermal dissipation material with a thermal conductivity higher than that of the semiconductor substrate or that of silicon oxide.

21 Claims, 22 Drawing Sheets

Related U.S. Application Data

(60) Provisional application No. 63/543,724, filed on Oct. 11, 2023.

(56) References Cited

U.S. PATENT DOCUMENTS

| | | | |
|---|---|---|---|
| 9,018,754 B2 * | 4/2015 | Gambino | H10P 90/1906 |
| | | | 438/122 |
| 12,224,225 B2 | 2/2025 | Lu | |
| 2004/0022102 A1 * | 2/2004 | Liang | H10W 20/071 |
| | | | 257/E21.546 |
| 2004/0222528 A1 | 11/2004 | Kunikiyo | |
| 2008/0224257 A1 | 9/2008 | Mori | |
| 2012/0146098 A1 | 6/2012 | Dahlstrom et al. | |
| 2015/0069571 A1 | 3/2015 | Gambino et al. | |
| 2015/0084128 A1 | 3/2015 | Gambino et al. | |
| 2015/0091129 A1 * | 4/2015 | Gambino | H10P 90/1906 |
| | | | 257/506 |
| 2016/0013184 A1 | 1/2016 | Alptekin et al. | |
| 2018/0151464 A1 | 5/2018 | Cook et al. | |
| 2018/0151471 A1 | 5/2018 | Cook et al. | |
| 2020/0185388 A1 | 6/2020 | Lu | |
| 2022/0077315 A1 | 3/2022 | Lu | |
| 2022/0108951 A1 | 4/2022 | Adusumilli et al. | |
| 2022/0285495 A1 | 9/2022 | Hung et al. | |
| 2025/0006584 A1 | 1/2025 | Lu | |
| 2025/0112116 A1 | 4/2025 | Lu | |
| 2025/0279333 A1 | 9/2025 | Lu | |
| 2025/0379117 A1 | 12/2025 | Lu | |

OTHER PUBLICATIONS

Partial Supplementary European Search Report for European Application No. 24205247.0, dated May 30, 2025.
U.S. Office Action for U.S. Appl. No. 19/004,132, dated Apr. 9, 2025.
US Office Action for U.S. Appl. No. 18/674,649, dated Nov. 4, 2024.
Japanese Office Action for Japanese Application No. 2024-177749, dated Aug. 26, 2025, with English translation.
Japanese Office Action for Japanese Application No. 2024-178689, dated Mar. 3, 2026, with English translation.
U.S. Office Action for U.S. Appl. No. 18/533,720, dated Feb. 6, 2026.
U.S. Office Action for U.S. Appl. No. 19/308,894, dated Jan. 2, 2026.

* cited by examiner

Top view

Cross section

Silicon P-type substrate

Top view

Cross section

Silicon P-type substrate

Top view

Cross section

Silicon P-type substrate

Top view

Cross section

Silicon P-type substrate

Top view

Cross section

Cross section

Top view

Cross section

Top view

102

8b --- --- 8b'

801

Cross section 101     102

801     801

401     702 t2 ~70nm t2 ~70nm t3=8nm     Vertical
Heat-Dissipation
Column(VHDC)

201     701     201

Horizontal Heat-Dissipation
Plate(HHDP)

Silicon P-type substrate

Top view

Cross section

Top view
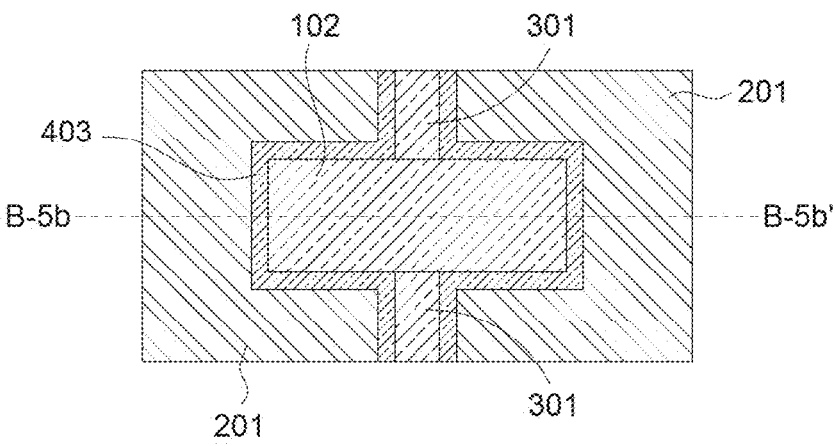
FIG. B-5a
Cross section
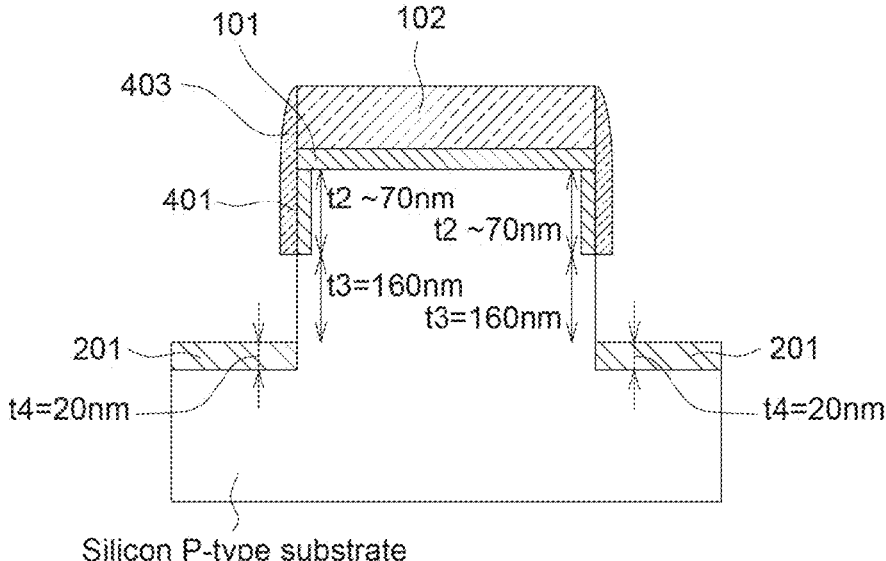
Silicon P-type substrate
FIG. B-5b Top view
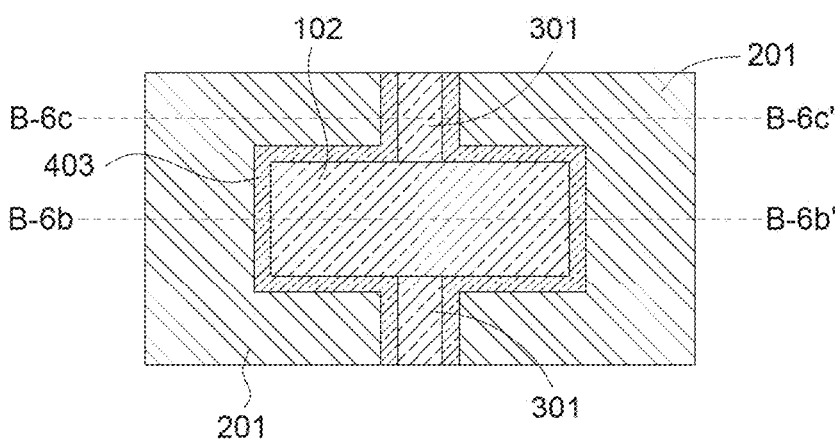
FIG. B-6a Cross section
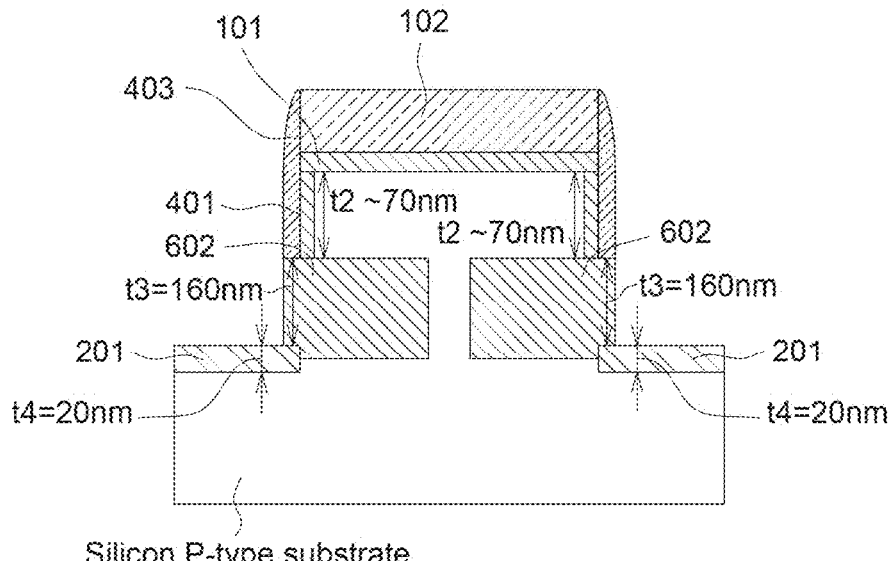
FIG. B-6b
Cross section
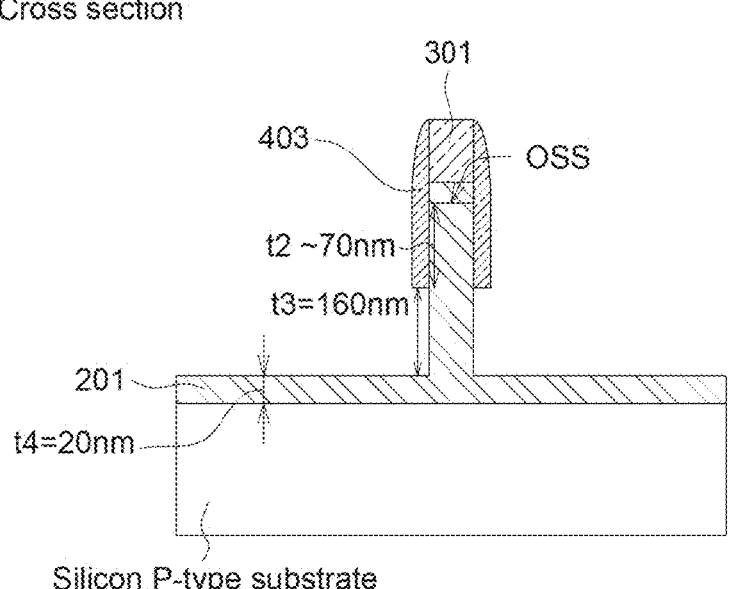
FIG. B-6c Top view
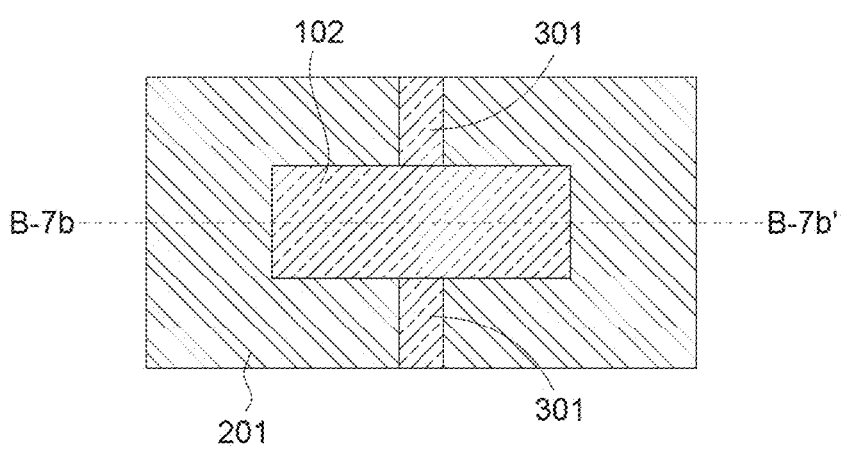
FIG. B-7a
Cross section
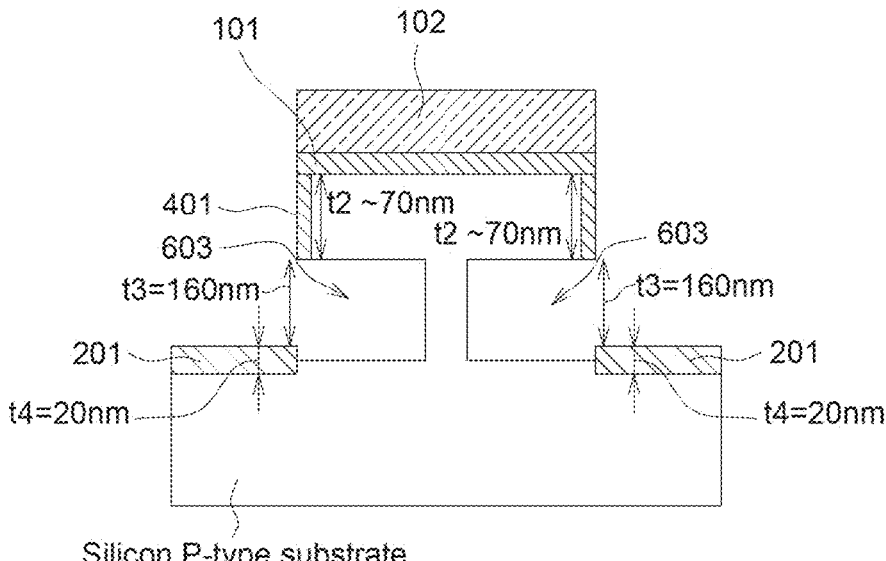
FIG. B-7b Top view
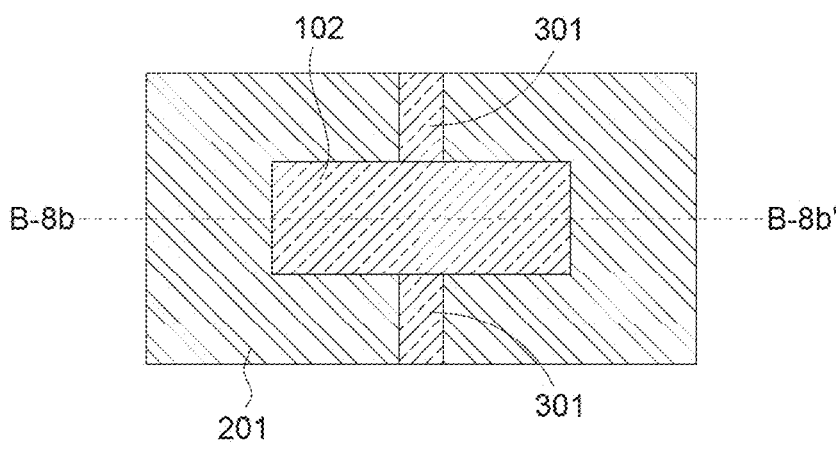
FIG. B-8a
Cross section
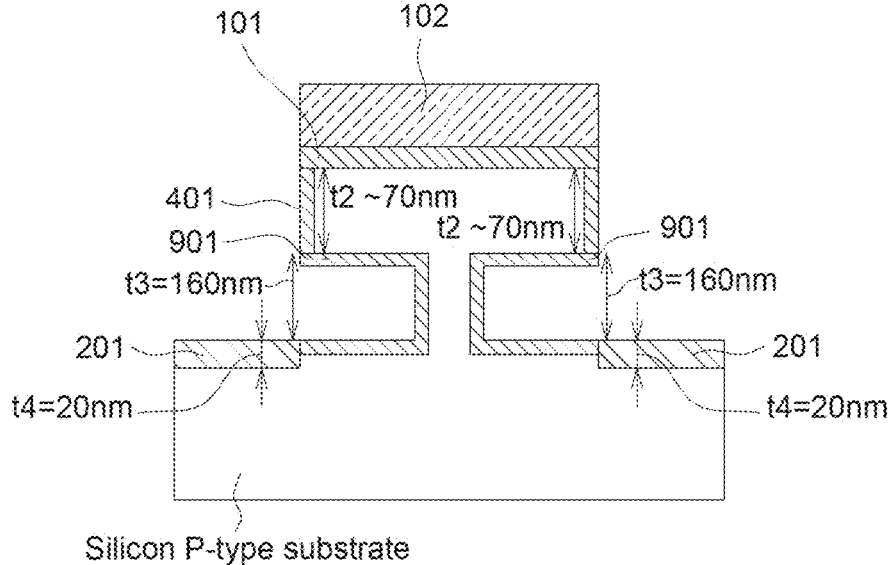
FIG. B-8b Top view
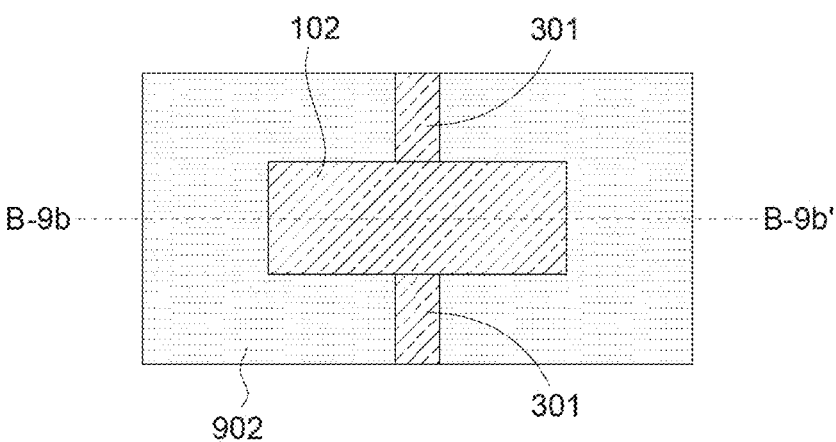
FIG. B-9a
Cross section
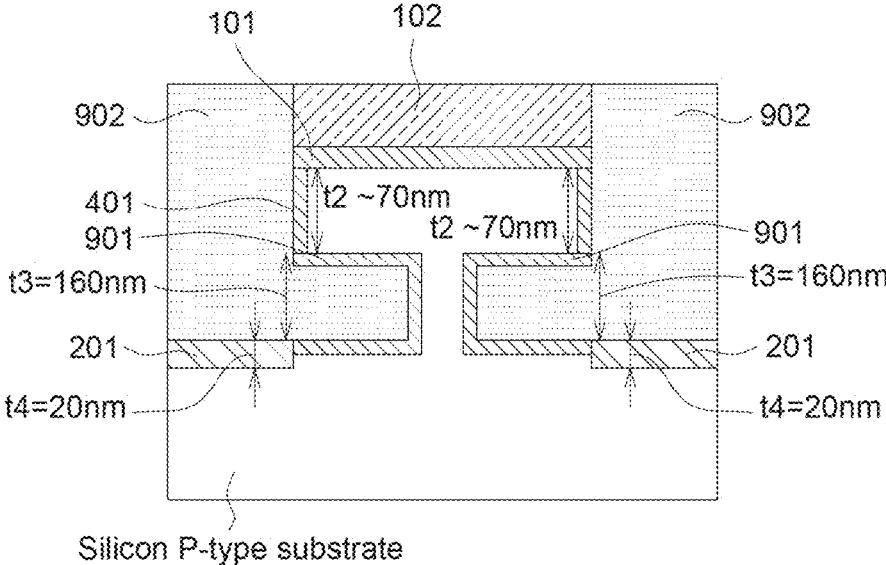
FIG. B-9b Top view
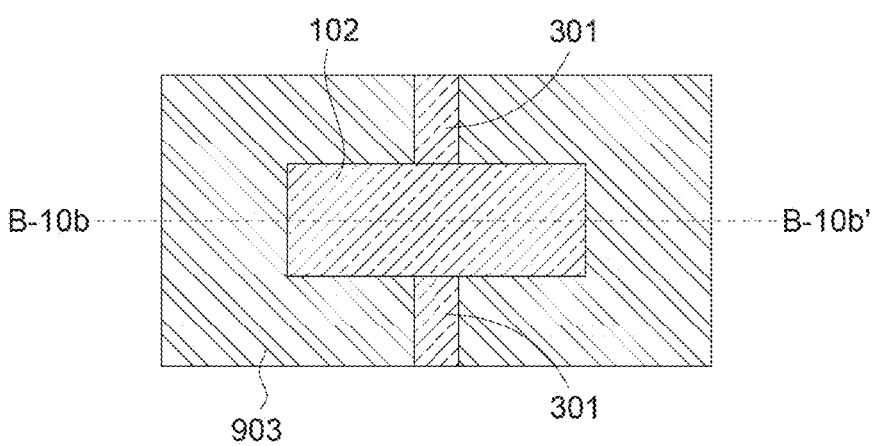
FIG. B-10a
Cross section
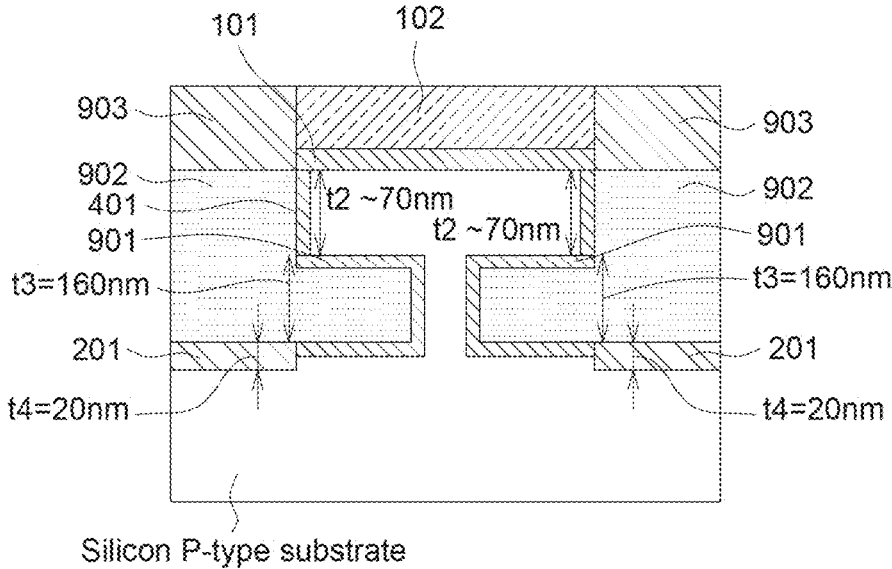
FIG. B-10b

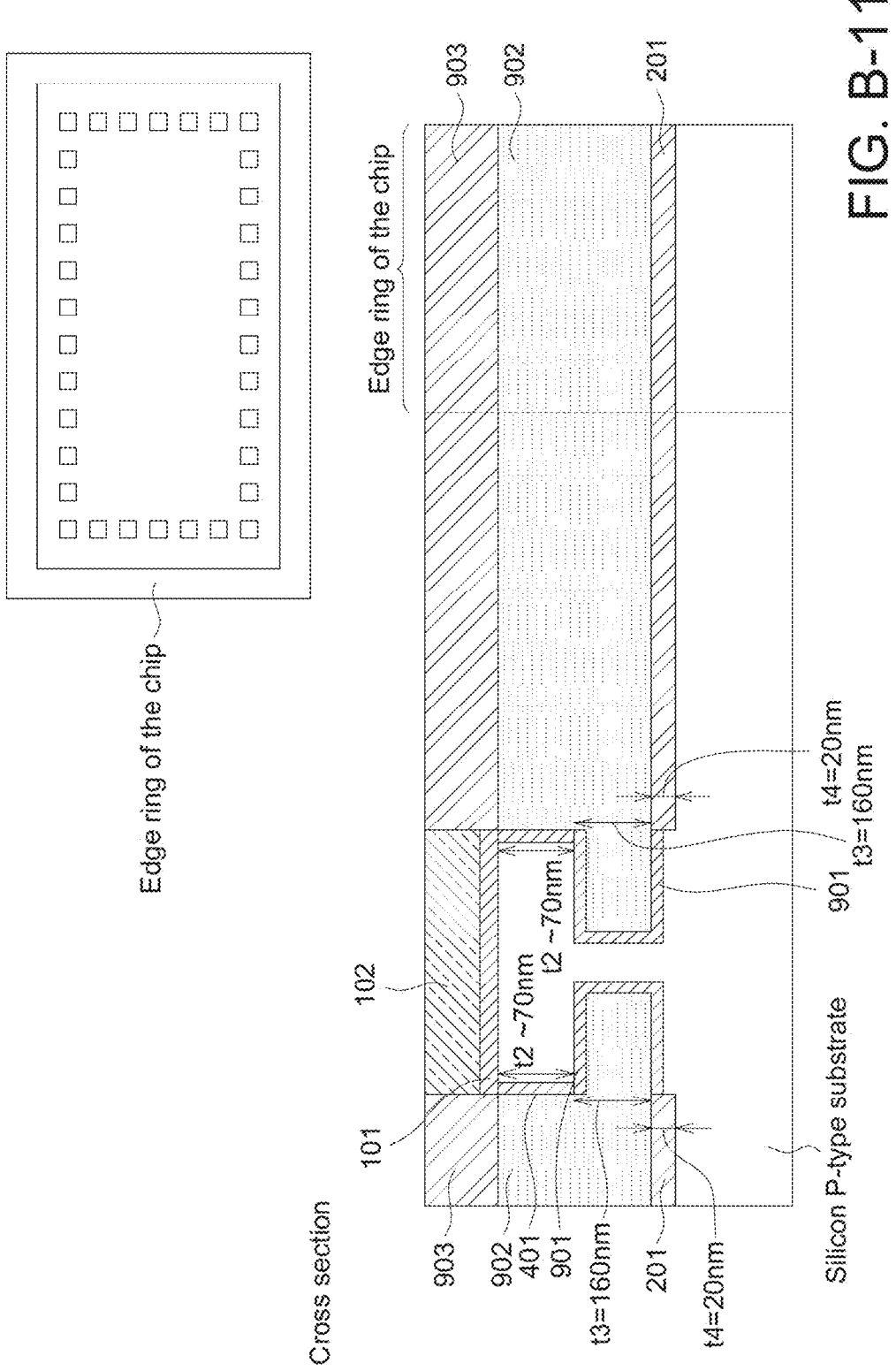
FIG. B-11

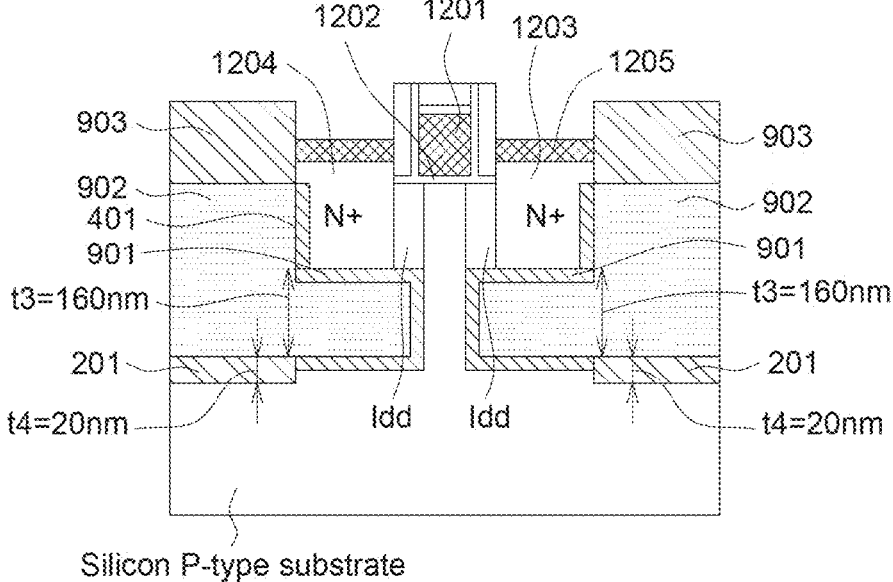
FIG. B-12

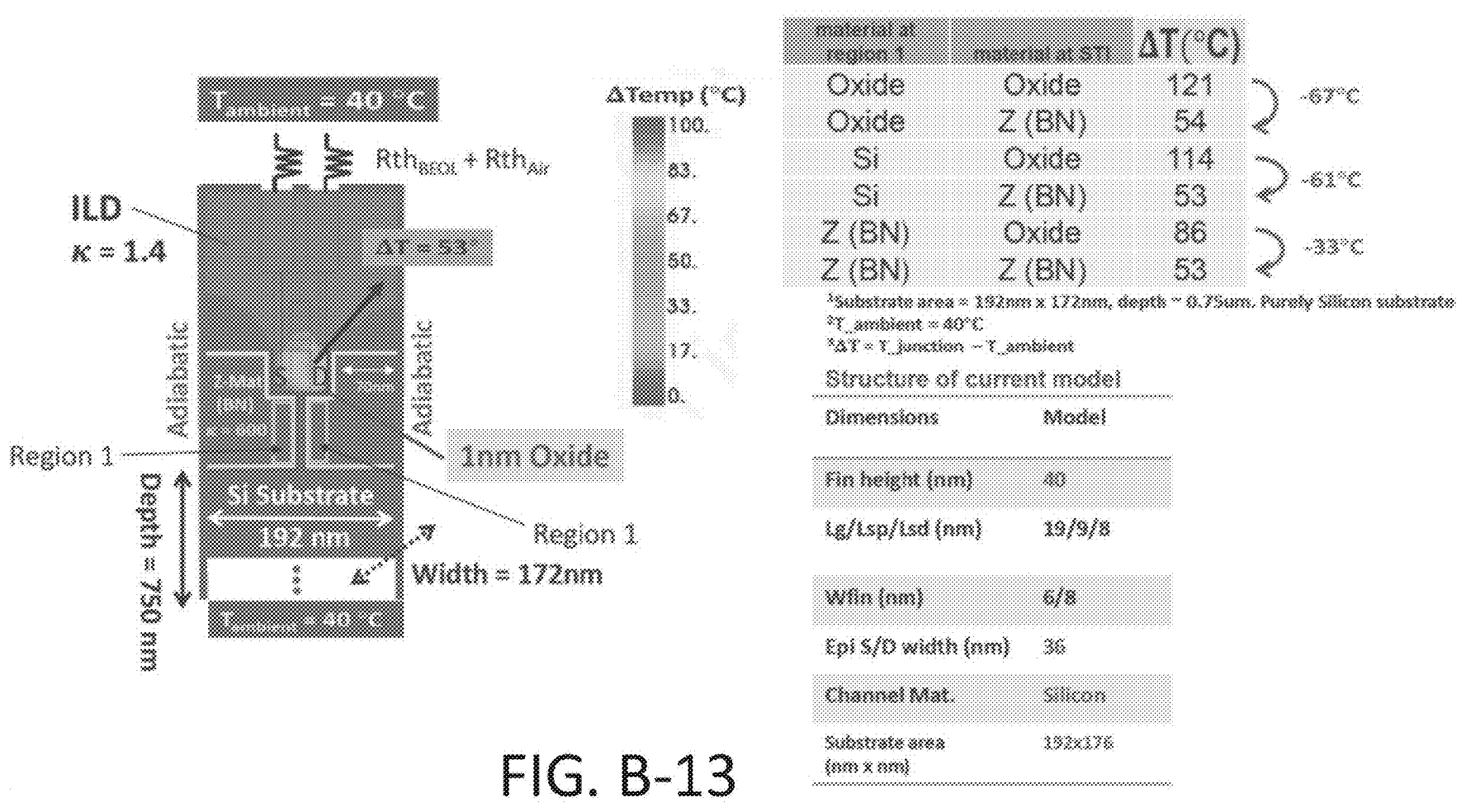

FIG. B-13

SEMICONDUCTOR DEVICE STRUCTURE WITH EFFICIENT HEAT-REMOVAL STRUCTURES ACROSS THE CHIP AND MONOLITHIC FABRICATION METHOD THEREFOR

CROSS REFERENCE TO RELATED APPLICATIONS

This application is a continuation of U.S. patent application Ser. No. 18/533,720 filed on Dec. 8, 2023, which claims the benefit of U.S. Provisional Application No. 63/543,724, filed on Oct. 11, 2023. The content of the application is incorporated herein by reference.

BACKGROUND OF THE INVENTION

1. Field of the Invention

The present invention relates to a semiconductor device structure, and particularly to a transistor structure and circuit thereof including heat removal structure (such as high thermal conductivity column and/or plate within the semiconductor substrate) to enhance heat dissipation generated by the transistor(s).

2. Description of the Prior Art

The monolithic integration capability of a Silicon chip has grown from GSI (Giga Scale Integration: Over billions of transistors on a die) toward TSI (Tera Scale Integration: Trillions of transistors on a die) soon and chip performance is being improved significantly. Accordingly the power consumption of running such a huge number of transistors is increasing sharply, which elevates adversely the junction temperature of transistors and thus the entire chip temperature due to current limited heat-dissipation capability (e.g. Thermal conductivity index of Silicon-dioxide is very low (1.3~1.5 W/m×K) and that of Silicon itself is not very high (~148 W/m×K)). This material and device structural problem causes a negative cyclic effect, that is, the elevated higher die temperature slows down the speed of transistors, and then inevitably enforcing the design to increase higher power to circuitry in order to accelerate the transistor performance but this mechanism causes badly raising the die temperature, and consequently the heat-dissipation problem is worse. Actually this getting insufficient heat dissipation problem causing higher temperature to chip operation is regarded as the worst problem for the entire chip industry to solve to avoid a major roadblock to a larger number of device integration on a die.

The progress of reducing the temperature of a GSI chip is not improved well as it should be, however. Actually as the transistor dimensions must be made smaller as the technology node is being scaled further (e.g. the minimum feature size is being scaled from 7 nm to 5 nm, then to 3 nm and so forth), the percentage of oxide coverage to the total transistor size is getting higher and the thermal dissipation capability across the device junctions is further being aggregated, Though a lot of heat dissipation methods are created, for example, covering the entire chip with higher heat-removal pad outside the chip or using a liquid cooling circulation outside the packaged chip, etc., all of which are very expensive but returned with low efficiency for effectively reducing the junction temperatures of transistors.

SUMMARY OF THE INVENTION

The present invention is focused on creating particularly High Heat-Removal (HHR) structures during the monolithic processes of making transistor itself. Such a HHR structure is kind of being connected over the entire die as a single piece of heat sink designed for enlarging the thermal dissipation area as much as possible. In addition, this HHR structures can be connected to the entire edge of the die so that it can be easier to be connected to some heating pads or thermal vias in order to create much larger thermal dissipation paths from the die to be facilitated to be connected to the outside environment of the die and thus the packaged chip.

This new HHR structure is considered as the most closeby path for achieving very effective heat sink function directly associated with individual transistor, and moreover all of these HHR structures are directly connected across the entire die as a piece of optimized "Heat Sink" built within the die (named as HSiD: Heat Sink in Die) or within the substrate. Thus, the present invention provides disclosure regarding how to use a familiar monolithic integration process to build a transistor with its associated HHR structure, and how a die itself can have an integrated internal HSiD for generating an effective thermal dissipation path within a chip.

An embodiment of the present invention provides a device structure including heat removal structure (such as high thermal conductivity and/or within column plate the semiconductor substrate) to enhance heat dissipation. The device structure comprises a semiconductor substrate with an original semiconductor surface; a circuit element located within a semiconductor body region of the semiconductor substrate; and a vertical heat dissipation column in the semiconductor substrate and surrounding the semiconductor body region. Wherein the vertical heat dissipation column comprises a thermal dissipation material with a thermal conductivity higher than that of the semiconductor substrate or that of silicon oxide.

According to one aspect of the present invention, the semiconductor substrate comprises an edge remote from the circuit element, and the vertical heat dissipation column extends from a position adjacent or next to the circuit element to the edge of the semiconductor substrate.

According to one aspect of the present invention, the thermal dissipation material is BN, AlN, or metal.

According to one aspect of the present invention, the vertical heat dissipation column comprises a layer of the thermal dissipation material and a thermal conductivity column covering the thin layer of the thermal dissipation material.

According to one aspect of the present invention, the thermal conductivity column comprises metal.

According to one aspect of the present invention, the semiconductor substrate comprises an edge remote from the circuit element, and the layer of the thermal dissipation material extends from a position adjacent or next to the circuit element to the edge of the semiconductor substrate.

According to one aspect of the present invention, the vertical heat dissipation column comprises a layer of the thermal dissipation material and an isolation column covering the thin layer of the thermal dissipation material.

According to one aspect of the present invention, the isolation column comprises silicon oxide.

According to one aspect of the present invention, the semiconductor substrate comprises an edge remote from the circuit element, and the layer of the thermal dissipation material extends from a position adjacent or next to the circuit element to the edge of the semiconductor substrate.

According to one aspect of the present invention, the device structure further comprises a shallow trench isolation (STI) region surrounding the semiconductor body region, wherein the vertical heat dissipation column is within the STI region.

According to one aspect of the present invention, the circuit element is a transistor, a resistor, a capacitor, a diode, or an inductor.

Another embodiment of the present invention provides a semiconductor device structure. The semiconductor device structure includes a semiconductor substrate with an original semiconductor surface; a first transistor located within a first semiconductor body region of the semiconductor substrate; a second transistor located within a second semiconductor body region of the semiconductor substrate, wherein the second transistor is remote from, rather than next to, the first transistor; and a vertical heat dissipation column in the semiconductor substrate, wherein the vertical heat dissipation column comprises a thermal dissipation material with a thermal conductivity higher than that of the semiconductor substrate or that of silicon oxide. Wherein the vertical heat dissipation column extends from the first semiconductor body region to the second semiconductor body region.

According to one aspect of the present invention, the semiconductor substrate comprises an edge remote from the first transistor and the second transistor, and the vertical heat dissipation column further extends to the edge of the semiconductor substrate.

According to one aspect of the present invention, the device structure further comprises a first horizontal heat dissipation plate right under the first transistor; and a second horizontal heat dissipation plate right under the second transistor. Wherein the vertical heat dissipation column connected to or thermally coupled to both the first horizontal heat dissipation plate and the second horizontal heat dissipation plate; and wherein the first horizontal heat dissipation plate and/or the second horizontal heat dissipation plate comprises another thermal dissipation material with another thermal conductivity higher than that of the semiconductor substrate or that of silicon oxide.

According to one aspect of the present invention, the thermal dissipation material and/or the another thermal dissipation material is BN, AlN or metal.

According to one aspect of the present invention, the first horizontal heat dissipation plate is connected to or thermally coupled to bottom surfaces of a drain region and a source region of the first transistor, and the first horizontal heat dissipation plate is connected to the vertical heat dissipation column; and the second horizontal heat dissipation plate is connected to or thermally coupled to bottom surfaces of a drain region and a source region of the second transistor, and the second horizontal heat dissipation plate is connected to the vertical heat dissipation column.

According to one aspect of the present invention, the device structure further comprises a shallow trench isolation (STI) region, wherein the vertical heat dissipation column is within the STI region.

According to one aspect of the present invention, a top surface of the STI region is higher than the original semiconductor surface; wherein a concave is formed between the STI region and a gate structure of the first transistor, and a metal plug is formed within the concave and contacted to the top of the drain region or the source region of the first transistor.

According to one aspect of the present invention, the first horizontal heat dissipation plate and/or the second horizontal heat dissipation plate further comprises a thin oxide layer covering the another thermal dissipation material.

These and other objectives of the present invention will no doubt become obvious to those of ordinary skill in the art after reading the following detailed description of the preferred embodiment that is illustrated in the various figures and drawings.

Fig. B-5 (including Fig. B-5a and Fig. B-5b) illustrates a top view and a cross-section view of another embodiment after deeper silicon sidewalls are revealed.

Fig. B-6 (including FIG. 6a, FIG. 6b and FIG. 6c) illustrates a top view and two different cross-section views of another embodiment after thermal oxide is formed along the deeper silicon sidewalls.

Fig. B-7 (including Fig. B-7a and Fig. B-7b) illustrates a top view and a cross-section view of another embodiment after vacant tunnel regions are formed.

Fig. B-8 (including Fig. B-8a and Fig. B-8b) illustrates a top view and a cross-section view of another embodiment after thin thermal oxide layers are formed.

Fig. B-9 (including Fig. B-9a and Fig. B-9b) illustrates a top view and a cross-section view of another embodiment after the high thermal dissipation material is deposited.

Fig. B-10 (including Fig. B-10a and Fig. B-10b) illustrates a top view and a cross-section view of another embodiment after the Horizontal Heat-Dissipation Plate (HHDP) and the Vertical Heat-Dissipation Column (VHDC) are formed.

Fig. B-11 is a diagram illustrating the HHDP and the VHDC of another embodiment are connected and extended to the edge of the chip/die.

Fig. B-12 is a diagram illustrating a cool transistor of another embodiment according to the present invention.

Fig. B-13 is a diagram illustrating simulation of 3D cool transistor operation and thermal generation model results.

DETAILED DESCRIPTION

The current most popular transistor uses the FinFET/Tri-gate structure in a CMOS circuit configuration with both NMOS and PMOS. Therefore a FinFET NMOS is used here as an example of describing the key features of this invention regarding High Heat-Removal (HHR) structures in substrate or die, which should be easily extended to PMOS or to other types of transistors such as GAA (All Gate Around), Sheet Transistor or Planar Transistor, etc. Another inventive feature is that the manufacturing method counts on only few processing steps.

Figure 1:
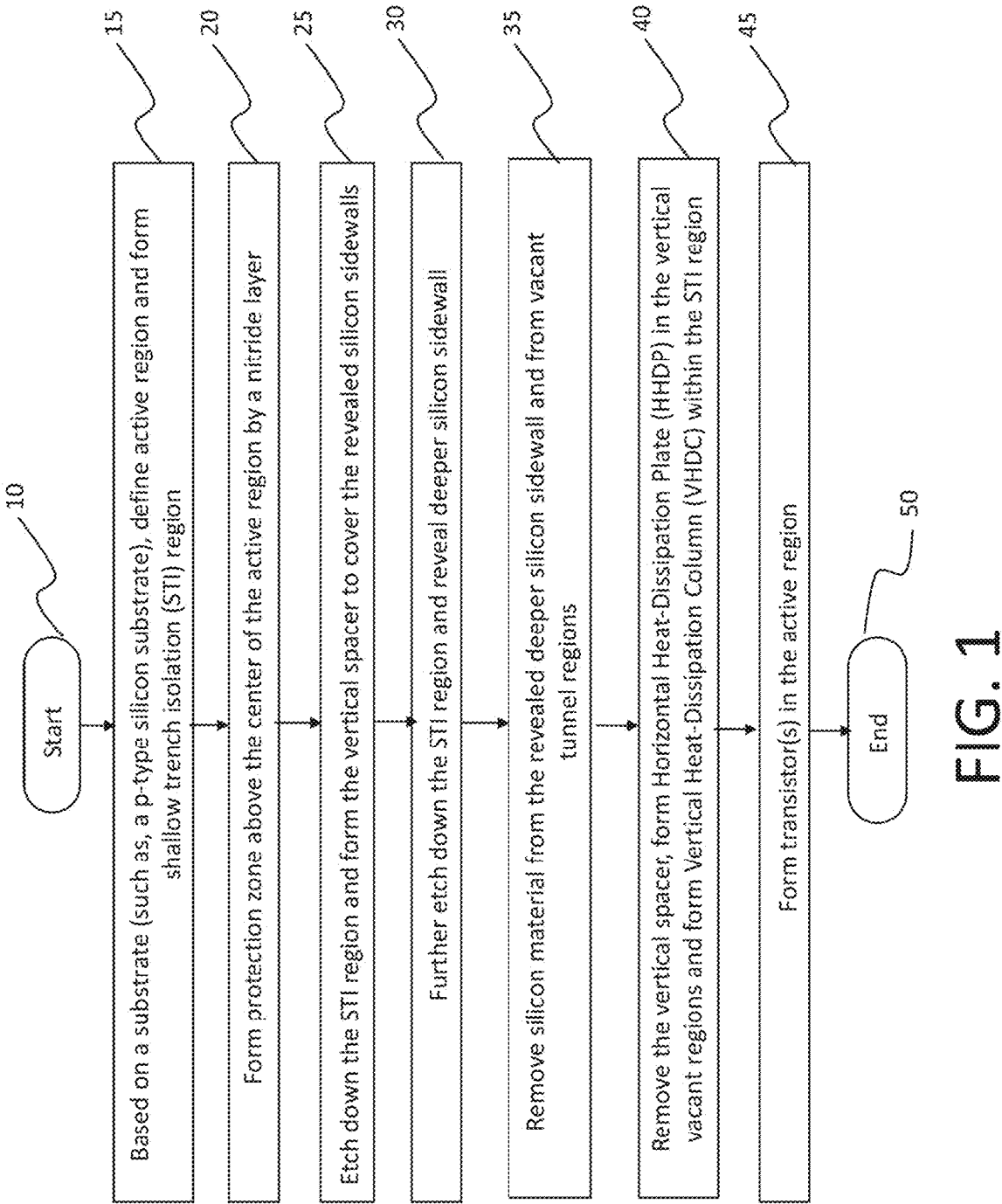
FIG. 1 is a flowchart illustrating a manufacturing method of High Heat-Removal (HHR) structures in substrate or die according to an embodiment of the present invention.

Next, please refer to FIG. 1 which is a flowchart illustrating a manufacturing method of High Heat-Removal (HHR) structures in substrate or die according to an embodiment of the present invention.

Step 10: Start.

Step 15: Based on a substrate (such as, a p-type silicon substrate), define active region and form shallow trench isolation (STI) region.

Step 20: Form protection zone above the center of the active region by a nitride layer.

Step 25: Etch down the STI region and form the vertical spacer to cover the revealed silicon sidewalls.

Step 30: Further etch down the STI region and reveal deeper silicon sidewall.

Step 35: Remove silicon material from the revealed deeper silicon sidewall and from vacant tunnel regions.

Step 40: Remove the vertical spacer, form Horizontal Heat-Dissipation Plate (HHDP) in the vertical vacant regions and form Vertical Heat-Dissipation Column (VHDC) within the STI region.

Step 45: Form transistor(s) in the active region.

Step 50: End.

Detailed description of the aforesaid manufacturing method is as follows.

1. Option A of Implementing the HHR Structure

Figure 2A:
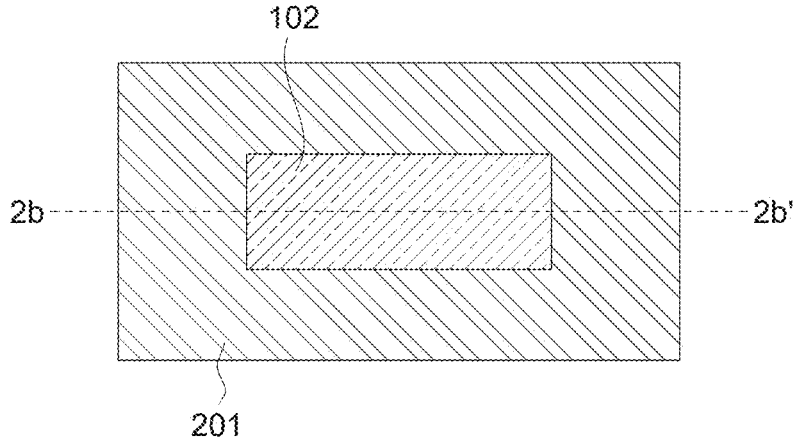
FIG. 2 (including FIG. 2a and FIG. 2b) illustrates a top view and a cross-section view after the active region and form shallow trench isolation (STI) region are formed.
Figure 2B:
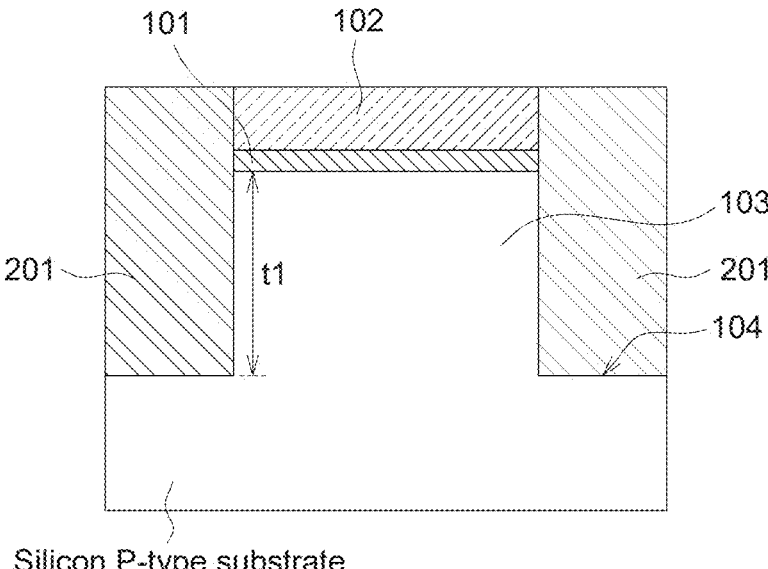

Please refer to FIG. 2 regarding Step 15. To begin with, on top of Silicon surface (Original Silicon Surface: OSS) a thin Pad-Oxide layer 101 is thermally grown and then a layer of Pad-Nitride-1 102 is deposited. Use the photolithographic etching technique the active region for having a transistor body or fin structure is defined and formed as an island active region 103 with the composite layer of Pad-Nitride-1 102 and the Pad-Oxide 101 over this active region 103, and outside of this active region 103 a concave trench region 104 (e.g. Its depth t1~250 nm) connected in the wafer has been formed. Then deposit a thick oxide and use the CMP (Chemical-Mechanical-Polishing) technique to make the STI (Shallow Trench Isolation) 201 with its top surface leveled up with the top surface of the Pad-Nitride-1 layer 102 (see FIG. 2, wherein the top view and the cross section are shown in FIG. 2a and FIG. 2b, respectively).

Figure 3A:
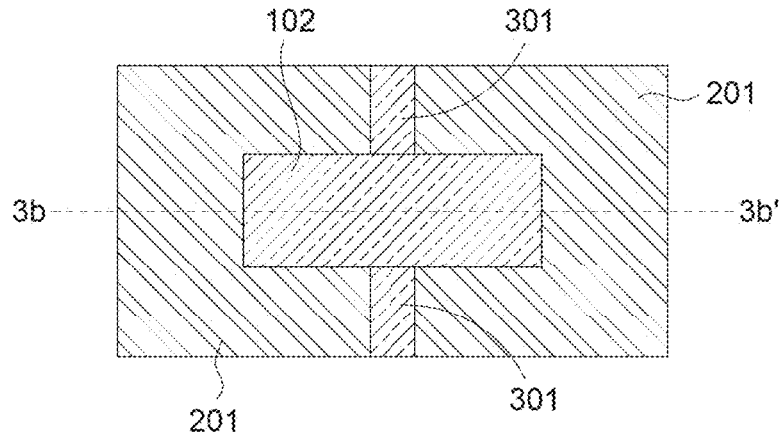
FIG. 3 (including FIG. 3a and FIG. 3b) illustrates a top view and a cross-section view after a protection zone made of nitride is formed above the center of the active region.
Figure 3B:
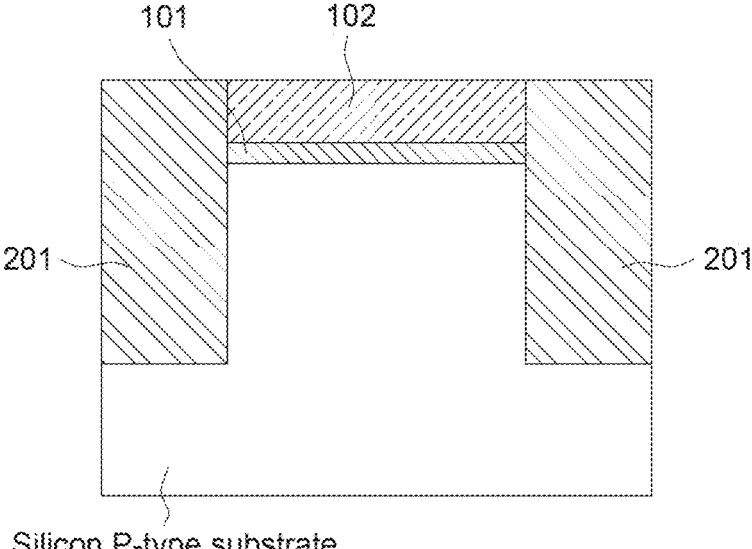

Please refer to FIG. 3 regarding Step 20. Deposit a Pad-Nitride-2 layer 301 and use the photolithographic mask technique to leave a portion of this Pad-Nitride-2 layer 301 at the center of the active region 103 which is designed to keep a Silicon Pillar region on purpose to ensure NMOS to be a bulk device not a SOI device (it will become clear later after FIG. 6). In FIG. 3, the top view and the cross section are shown in FIG. 3a and FIG. 3b, respectively.

6

Figure 4A:
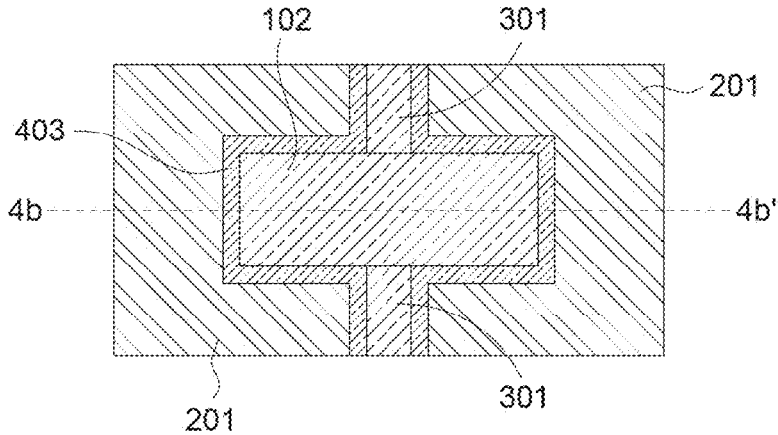
FIG. 4 (including FIG. 4a and FIG. 4b) illustrates a top view and a cross-section view after a vertical spacer is formed to cover the revealed silicon sidewalls.
Figure 4B:
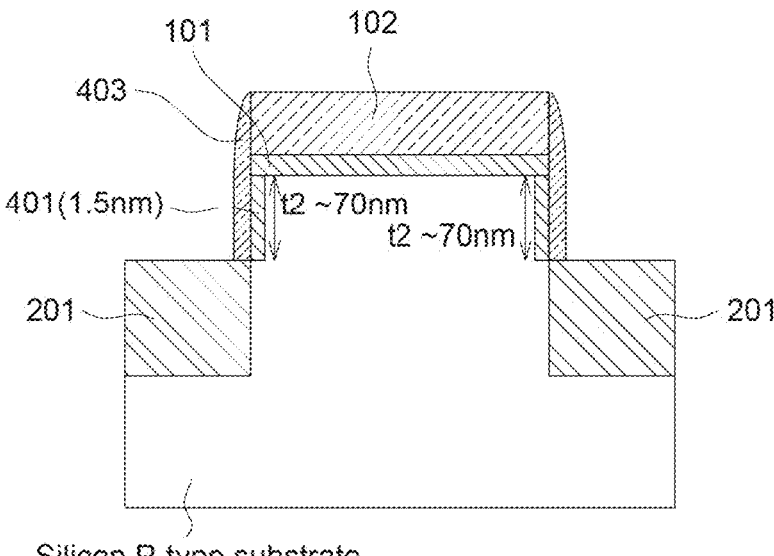

Please refer to FIG. 4 regarding Step 25. Etch away the oxide inside the exposed STI region 201 to a depth of t2 (e.g. 70 nm deep). Keep the Pad-Nitride-2 layer 301 but also keep that the oxide of the STI region 201 inside the area protected by the Pad-Nitride-2 layer 301 is untouched and remains as tall as up to the level of the surface of the Pad-Nitride-1 layer 102. So all the silicon surfaces under the OSS (Original Silicon Surface) are exposed. Then use a thermal oxidation proceed to grow a thin layer of oxide 401 on these sidewalls (e.g. the thickness is about 1.5 nm). Afterward, deposit another Pad-Nitride-3 layer 403. Use an anisotropic etching technique to make the Pad-Nitride-3 layer 403 as spacers on the vertical sidewalls. Under an appropriate design on purpose, the Pad-Nitride-2 layer 301 is remained on its planar surface but is getting thinner due to the anisotropic etching of making the Pad-Nitride-3 spacer 403 (see FIG. 4, wherein the top view and the cross section are shown in FIG. 4a and FIG. 4b, respectively).

Figure 5A:
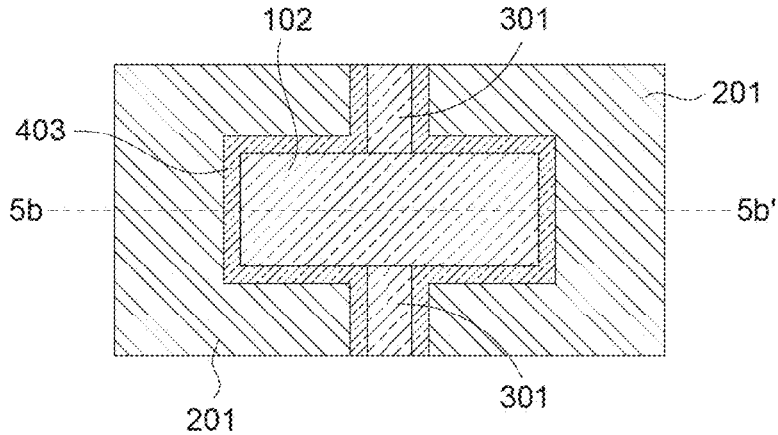
FIG. 5 (including FIG. 5a and FIG. 5b) illustrates a top view and a cross-section view after deeper silicon sidewalls are revealed.
Figure 5B:
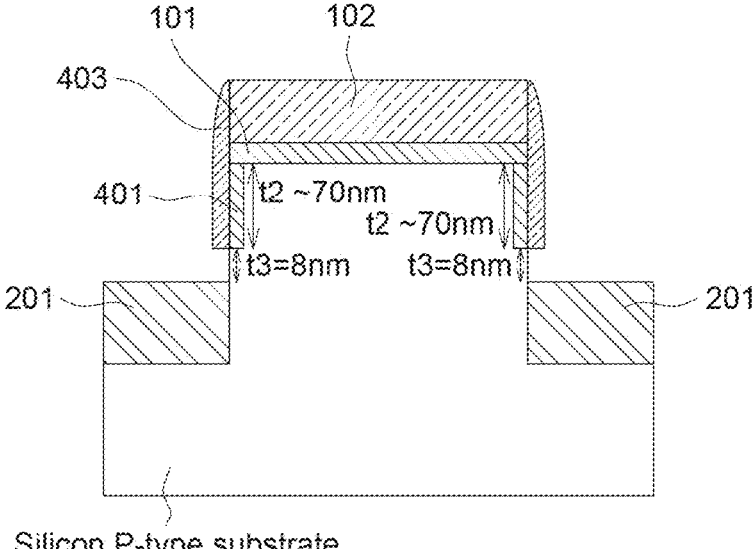

Please refer to FIG. 5 regarding Step 30. Use an anisotropic etching technique to remove the exposed oxide layer inside most of the STI region 201 by a thickness of t3=8 nm, which results in a planar oxide surface with its distance from the top of the exposed oxide surface to the OSS by a distance around 78 nm (t2+t3), Use an isotropic etching technique to remove the exposed thin oxide layers 401 about a thickness of 1.5 nm so that the silicon on sidewalls is revealed (see FIG. 5, wherein the top view and the cross section are shown in FIG. 5a and FIG. 5b, respectively).

Figure 6A:
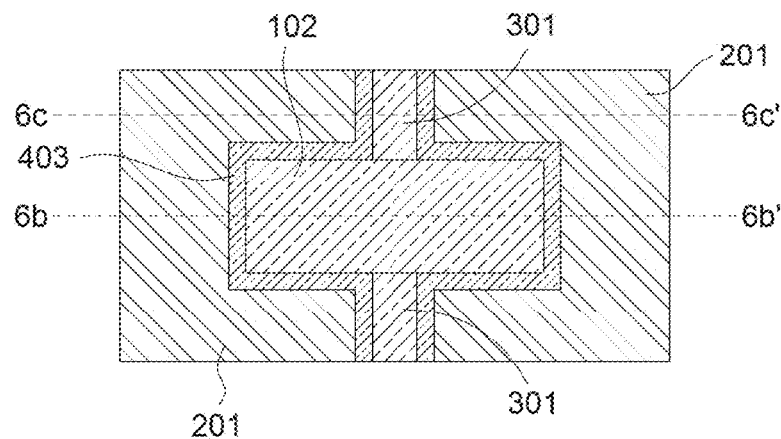
FIG. 6 (including FIG. 6a, FIG. 6b and FIG. 6c) illustrates a top view and two different cross-section views after vacant tunnel regions are formed.
Figure 6B:
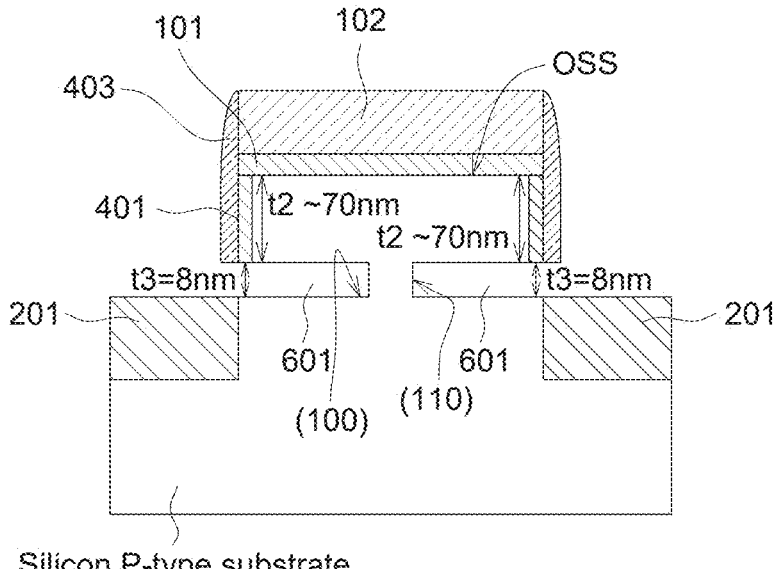
Figure 6C:
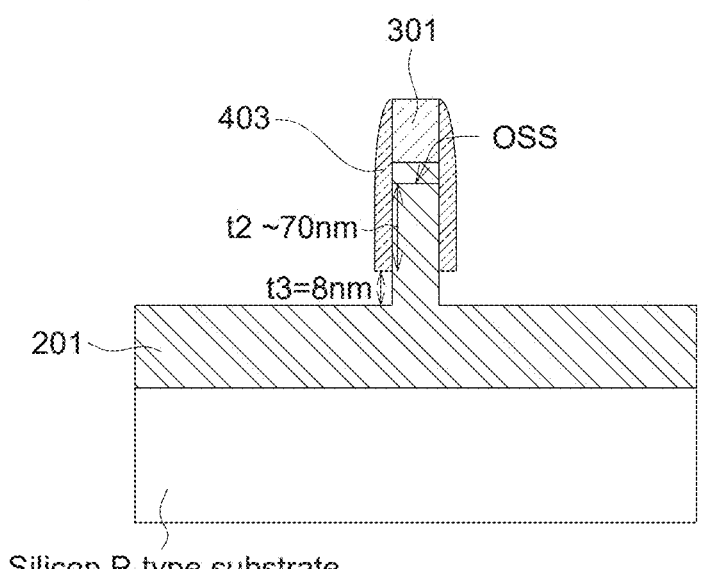

Please refer to FIG. 6 regarding Step 35. Use an isotopic etching technique to remove part of the exposed silicon surface, especially that etching rate over the crystalline orientation of (110) can be optimally adjusted in much faster than that of (100) (see the Reference [1], Prem Pal, Kazuo Sato et al. "Surfactant Adsorption on Single-Crystal Silicon Surfaces in TMAH Solution: Orientation-Dependent Adsorption Detected by In Situ Infrared Spectroscopy" JOURNAL OF MICROELECTROMECHANICAL SYSTEMS, VOL. 18, No. 6, December 2009 pp 1345-1356). Therefore the silicon layer along the created exposed region can be removed to form vacant tunnel regions 601, but the removal process can be well controlled to be terminated at an appropriate adjustment time to leave the silicon protected by the vertical distance underneath the Pad-Nitride-3 spacer 403 (see FIG. 6, wherein the top view and the cross section are shown in FIG. 6a and FIG. 6b, respectively; the top view and the cross section based on different cut line are shown in FIG. 6c).

It should be noticed here that we can use a different process to accomplish the similar structure as show in FIG. 6. For example, after the structure was created as shown in FIG. 5, then instead of using the aforementioned isotropic etching technique to remove part of the exposed silicon surface, a thermal oxidation process can be used to grown away the exposed silicon areas. Since the exposed silicon area can have somewhat narrow horizontal distance, the grown oxide layer (such as thermal oxide) underneath the top surface of the silicon island can fill the horizontal void quickly with nice smooth close-up shape but the bulk silicon material under the coverage of the Pad-Nitride-3 spacer 403 is well protected to connect the semiconductor body region of the transistor to the wafer substrate as a strong pillar area without being oxidized too much. Then use an isotropic etching technique to remove this thermal oxide to result in similar structures shown in FIG. 6. One embodiment of the aforesaid thermal oxidation and etching process to remove silicon will be introduced in Option B hereunder.

Figure 7A:
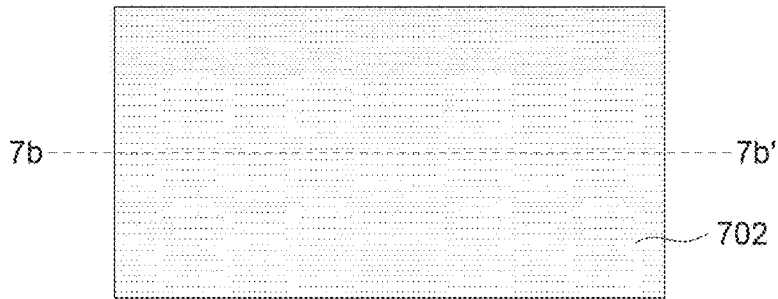
FIG. 7 (including FIG. 7a and FIG. 7b) illustrates a top view and a cross-section view after the high thermal dissipation material is deposited.
Figure 7B:
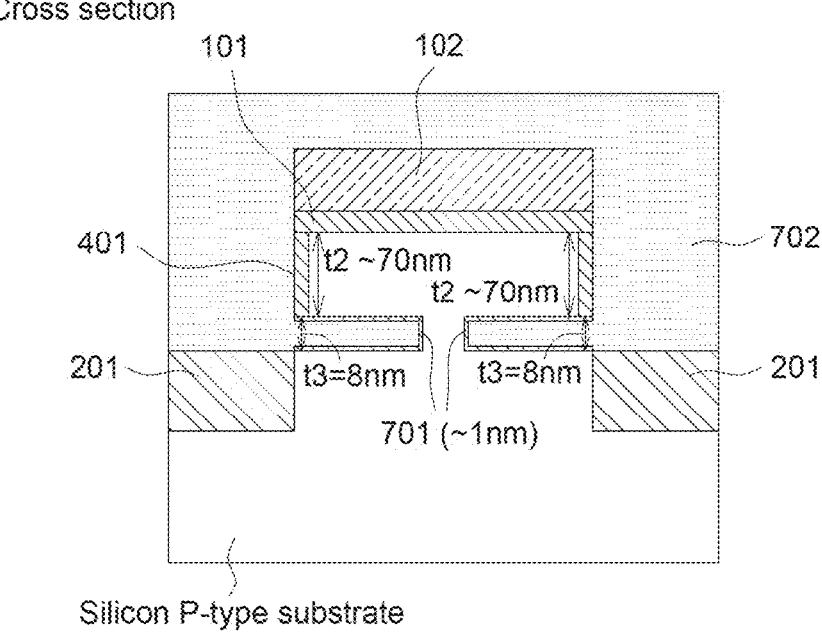
Figure 8A:
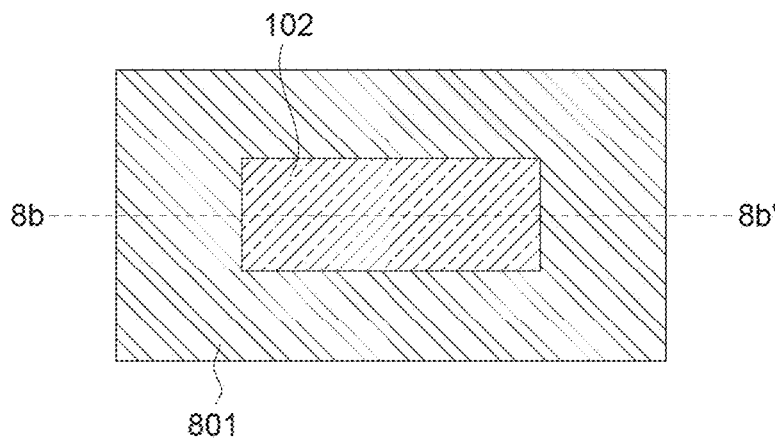
FIG. 8 (including FIG. 8a and FIG. 8b) illustrates a top view and a cross-section view after the Horizontal Heat-Dissipation Plate (HHDP) and the Vertical Heat-Dissipation Column (VHDC) are formed.
Figure 8B:
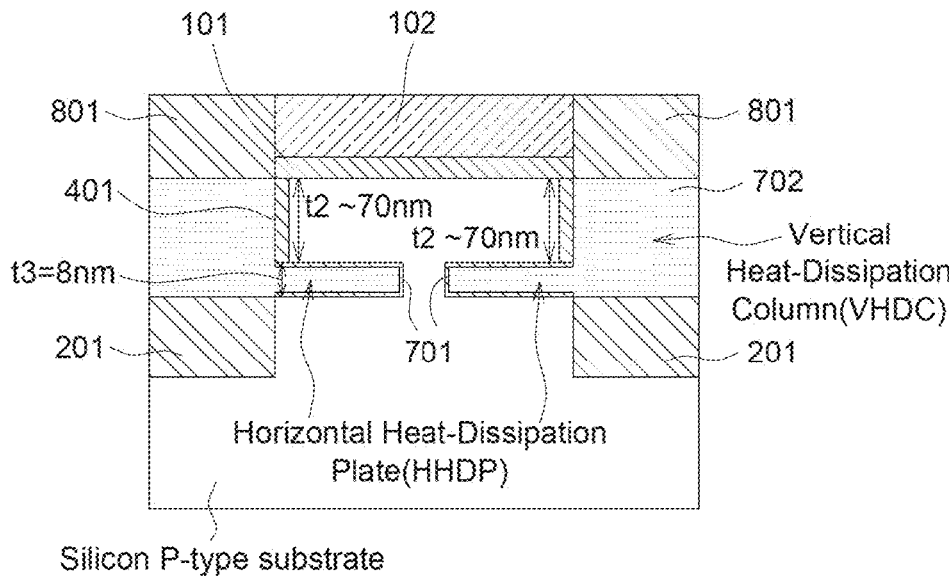

Please refer to FIGS. 7-8 regarding Step 40. Adopt an isotropic etching technique to take away the Pad-Nitride-3 spacer 403. Use a thermal oxidation process to grow a very thin oxide layer 701 (e.g. 1 nm) to well protect the just created and exposed silicon surface. Then select a suitable material which has very high thermal conductivity but is an insulator n terms of electrical conductivity (such as Boron-Nitride, BN, which is an electrical insulator but has very high thermal conductivity, such as 600 W/m×K versus 149 W/m×K of silicon material (Refer to [2], https://en.wikipedia.org/wiki/Boron_nitride), and can be used to fill the hole effectively by CVD (Chemical Vapor Deposition) process; or use Aluminum-Nitride, AlN, material which has its thermal conductivity as high as 321 W/m×K (Refer to [4], https://en.wikipedia.org/wiki/Aluminium_nitride), or any other suitable material which is used as so-called Z material 702). Then use a CVD process to fill in the vacant tunnel regions 601 as created by the aforementioned processing results, for example, BN is selected. Of course, the vacancy inside the STI area is filled by BN material (see FIG. 7, wherein the top view and the cross section are shown in 7a and 7b, respectively).

Thereafter, a CMP technique can be used to take away the BN material or Z material 702 over the Pad-Nitride-1 layer 102 to a planar surface topography, and an anisotropic etching technique is further used to remove some BN material or Z material 702 over the STI region 201. Then deposit a layer of oxide 801 over the surface and level up to the Pad-Nitride-1 layer 102. After removal of the Pad-Nitride-2 layer 301, the silicon surface is covered by the Pad-Nitride-1 layer 102 and oxide-covered STI region 201, and the familiar processes can be carried on to complete the MOS transistors in the remaining semiconductor active region (see FIG. 8, wherein the top view and the cross section are shown in 8a and 8b, respectively).

So some BN material or Z material 702 is filled into the vacant tunnel regions under the silicon body region of the FinFET/Tri-gate device and is protected from the semiconductor body and the wafer substrate, it is thus given a name as Horizontal Heat-Dissipation Plate (HHDP), as shown in FIG. 8. Some material is filled into the STI's vertical vacant area, which is then named as Vertical Heat-Dissipation Column (VHDC). In the new device structure the Source/Drain regions of the transistor are positioned in both HDDP and VHDC which have higher thermal conductivity than that of either silicon or silicon dioxide materials surround the conventionally designed transistor. Actually the hottest areas of transistor in full operation are centered at the p/n junction areas between the drain region and the source region both connected with the channel region of the transistor, respectively, these HDDP and VHDC structures are very effective to dissipate the heat generated in those p/n junction regions.

Figure 9A:
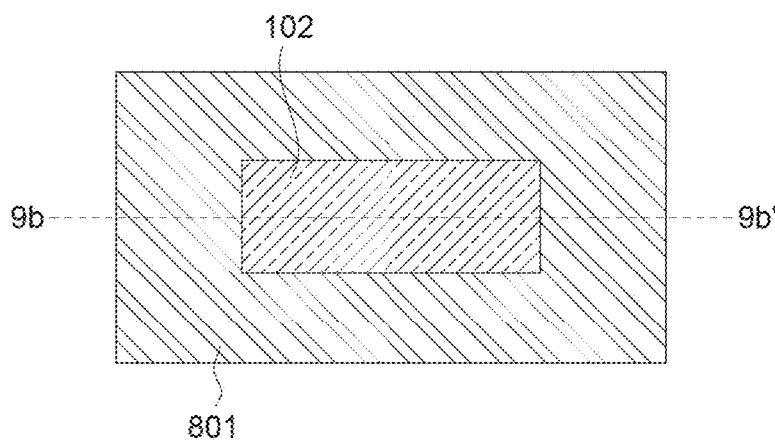
FIG. 9 (including FIG. 9a and FIG. 9b) illustrates a top view and a cross-section view of another embodiment after the HHDP and the VHDC are formed.
Figure 9B:
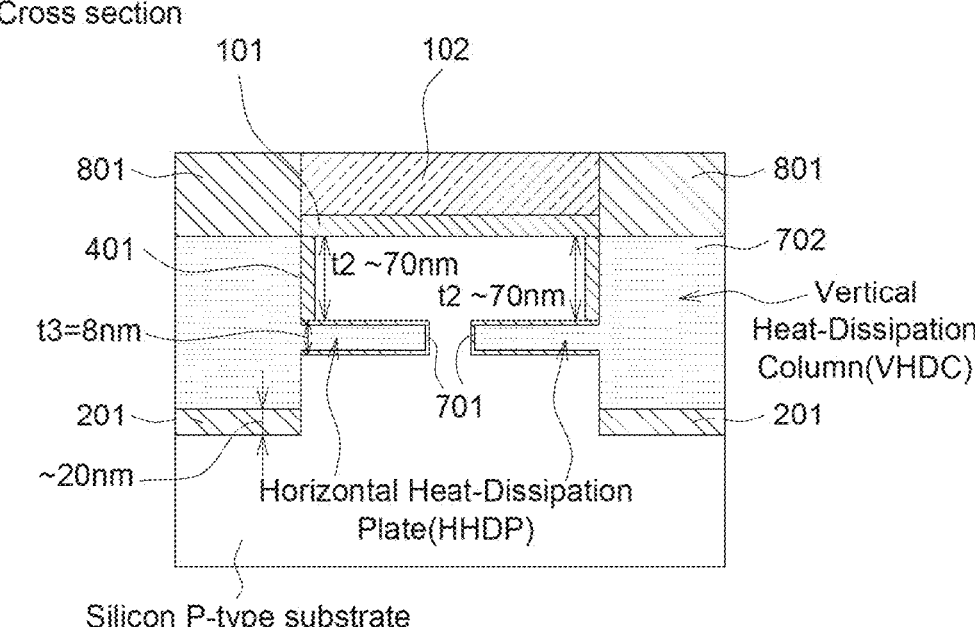

After describing the key points of this invention, more variations of designing HDDP and VHDC can be elaborated in the following. For example, after the BN material or Z material 702 is completed by CVD process, the key point is to insert this high thermal conductivity material into the vacant tunnel regions 601. Then an anisotropic etching technique can be used to take away the BN material or Z material 702 standing vertically inside the STI region 201. Then the bottom oxide material of the STI region 201 can be also taken away or etched down by using an anisotropic etching technique (e.g. only 20 nm-thick oxide can be retained inside the STI region without hurting the BN materials already inserted in the vacant tunnel regions 601 horizontally). Then with the second time of depositing BN material or Z material 702 into the vacancies of the STI regions, this two-step of forming BN material or Z material 702, first for HHDP, then the second for optimizing the volume of BN or Z material 702 inside all STI regions (see FIG. 9, wherein the top view and the cross section are shown in 9a and 9b, respectively).

Figure 10:
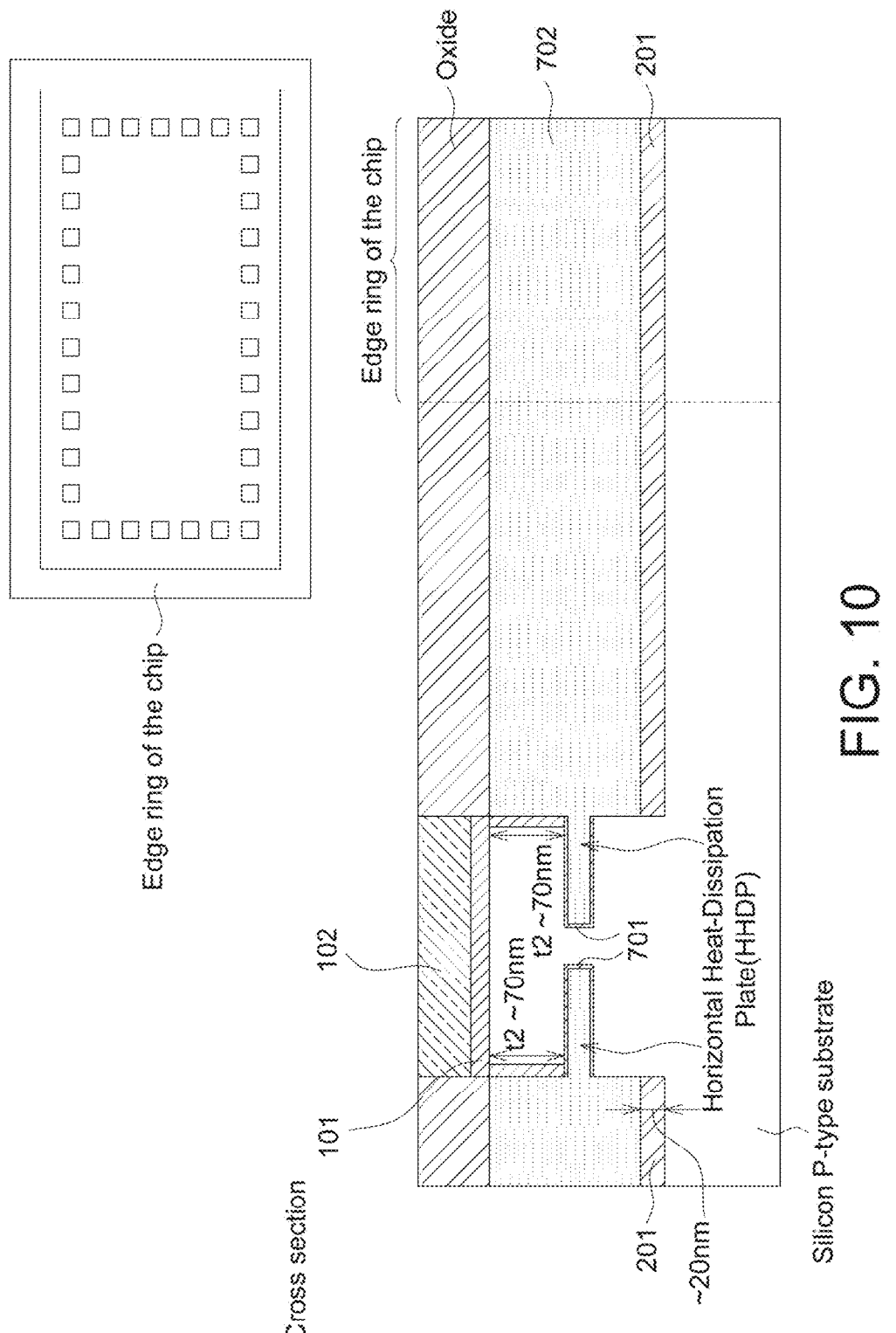
FIG. 10 is a diagram illustrating the HHDP and the VHDC are connected and extended to the edge of the chip/die.

It is also noted that the STI regions 201 are spread all over the wafer substrate. With HHDP materials all laid below the body region of MOSFETs/transistors and are connected to all the VHDC material inside the STI regions 201, this constructed high thermal dissipation materials network can work out as the connected heat-dissipation sink from the operated PN junctions of transistors. By designing these Z material heat-dissipation sink inside the monolithic die by utilizing the familiar monolithic processing recipe which is all connected to an edge ring of the chip or die, the BN material or Z material 702 inside STI region 201 can be contacted by opening its top surface so that an entire Die's heat-dissipation sink can be connected to the outside edge of the chip/die for even more directly and effectively dissipating the heat (see FIG. 10). For example, a lead frame can be designed to fulfill this function by directly connecting the BN materials or Z material 702 much big areas of lead-frame materials, or a flip-die connection method can be used to dissipate the heat derived from all the HHDP and HHDC structures proposed in this invention. Of course, there could be two or more body regions in the semiconductor substrate, and each body region is surrounded by the BN materials or Z material 702 extending from one body region to another body region, and further extending to the edge of the chip/die. Each body region could accommodate the circuit element, such as transistor.

Besides the heat-dissipation sink connected from the top surface to the VHDC (and/or the HHDP) within the die/chip at the outside edge of the chip/die for dissipating the heat (see FIG. 10), in another embodiment the die/chip with the VHDC (and/or the HHDP) could be thinned first and then opened to reveal the VHDC (and/or the HHDP), such that another substrate with thermal vias or heat sink could be connected to the VHDC (and/or the HHDP) from the bottom of the die/chip.

Another possibility is to use similar methods described in this embodiment to create not only a first HHDP structure but also in a deeper distance from the OSS (Original Silicon Surface) a second HHDP structure can be created inside the monolithic transistor area. This can increase more HHDPs to enlarge the thermal dissipation areas.

Figure 11:
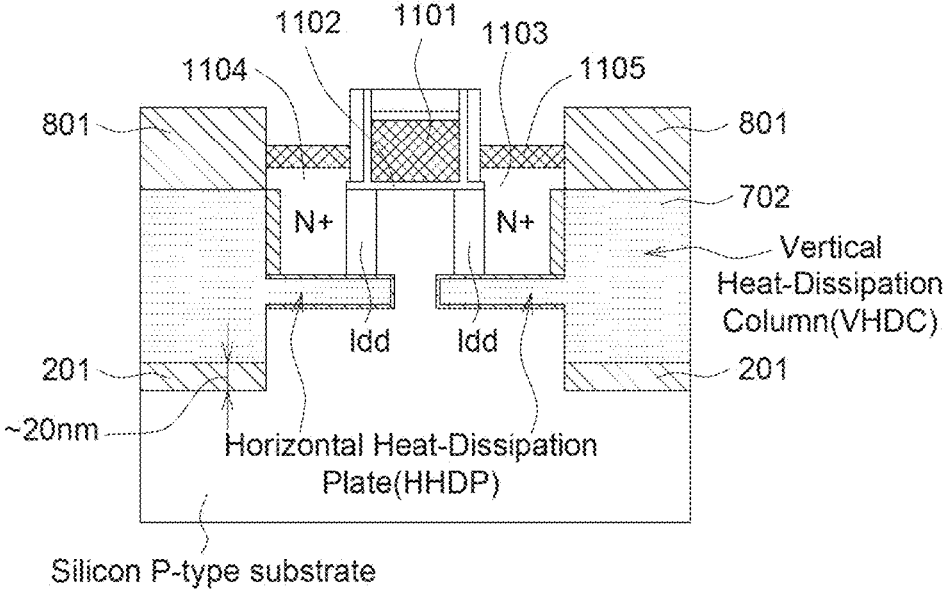
FIG. 11 is a diagram illustrating a cool transistor according to the present invention.

FIG. 11 shows the final transistor structure with the HHDP and VHDC microstructures for a new "Cool Transistor (CQT)" which is the best term to describe one embodiment of the present invention. Such a CQT structure can realize the scaling-up (more transistors) and scaling-down (smaller transistor size) strategy from present GSI (GigaScale Integration) to the near-future TSI (Tera Scale Integration) era. The newly created thermal dissipation path for a chip or die is directly to generate heating paths from a transistor level to the entire die level. As described above there is some design which can connect the die-level thermal path to a chip-level thermal path which can certainly an effective heat-dissipation sink for a chip package and/or for some heterogeneous integration module (e.g. Through TSV or TIV, etc.) under the present cooling method out of die and package/heterogeneous integration module.

In FIG. 11, the transistor comprises a gate structure which includes a gate metal region 1101 and a Hi-K dielectric 1102. The transistor also comprises a source region 1103 which includes a lightly-doped region laterally extending from a sidewall of the substrate and a heavily-doped region laterally extending from the sidewall of the lightly-doped region. Those lightly-doped region and heavily-doped region are formed by selective growth methods, such as epitaxial growth methods. Over the top of the source region 1104 there is a metal contact 1105 between the gate structure of the transistor and the STI region 801. It is noticed that the top surface of the STI region 801 is higher than the Oss, such as level up with the top of the gate structure, such that a contact hole is automatically formed without using photo lithography process to form such contact hole, and therefore the metal contact 1105 would be self-aligned with the source region 1103. Moreover, in another embodiment, the metal contact 1105 could not only be connected to the top of the source region 1103, but also connected to the most lateral sidewall of the source region 1103. The transistor also comprises a drain region 1104 the structure of which is the same or substantially the same as that of the source region 1103, and the description thereof is omitted.

Furthermore, in another embodiment, the processes to form the Horizontal Heat-Dissipation Plate (HHDP) could be skipped and only the Vertical Heat-Dissipation Columns (VHDC) are constructed. Since the Vertical Heat-Dissipation Columns (VHDC) are within the STI region 201 which is distributed all over the die/chip, those constructed VHDC are also thermally connected together. Thus, this constructed high thermal dissipation VHDC network can work out as the connected heat-dissipation sink from the operated PN junctions of transistors in the die/chip.

The VHDC could be made of a single high thermal dissipation material as previously mentioned, and could be made of a composite structure as well. For example, the VHDC comprises a layer (or thin layer) of first high thermal dissipation material (such as BN, AlN, etc.) and anther metal or metal-like column covering the first high thermal dissipation material, Since the VHDC is within the STI region and the metal-like material is surrounded by the first high thermal dissipation material which is a non-conductive during the operation of the transistors in the die/chip, the material-like material of the VHDC will not impact the operation of the transistors in the die/chip. In another embodiment, the VHDC comprises a layer (or thin layer) of first high thermal dissipation material (such as BN, AlN, etc.) and anther non-conductive column (such as oxide) covering the first high thermal dissipation material. Such layer of first high thermal dissipation material could further extend to edges of the die/chip, and form heat dissipation network as previously mentioned.

2. Option B of Implementing the HHR Structure

The following describe another embodiment of the present invention based on Option B processes, Based on previous FIG. 4*a* and FIG. 4*b*, use an anisotropic etching technique to remove the exposed oxide layer inside most of the STI regions 201 by a thickness of t3=160 nm, which results in a planar oxide surface with its distance from the top of the exposed oxide surface to the Original Silicon Surface by a distance around 230 nm (t2+t3). Use an isotropic etching technique to remove the exposed thin oxide layers 401 about a thickness of 1.5 nm so that the silicon on sidewalls is revealed (see Fig. B-5, wherein the top view and the cross section are shown in B-5*a* and B-5*b*, respectively).

As previously mentioned, instead of etching exposed silicon on sidewalls directly, in Option B, the thermal oxidation process is used to grow away the exposed silicon on sidewalls. Since the exposed silicon area can have somewhat narrow horizontal distance (especially true for FinFET which may have the transistor's planar width <20 nm), so the grown thermal oxide layer 602 underneath the silicon island or active region 103 can fill the horizontal void quickly with nice smooth close-up shape but the bulk silicon material under the coverage of the Pad-Nitride-3 spacer 403 is well protected to connect the semiconductor body region of the transistor to the wafer substrate as a strong pillar area without being oxidized too much (see Fig. B-6, wherein the top view and the cross section are shown in Fig. B-6*a* and Fig. B-6*b*, respectively; another cross section based on different cut line is shown in Fig. B-6*c*).

Then use an isotropic etching technique to remove the grown thermal oxide layer 602 to result in a horizontal hallow or tunnel area 603. Adopt an isotropic etching technique to take away the Pad-Nitride-3 spacer 403 (see Fig. B-7, wherein the top view and the cross section are shown in Fig. B-7*a* and Fig. B-7*b*, respectively).

Use a thermal oxidation process to grow a very thin oxide layer 901 (e.g. 1 nm) to well protect the just created and exposed silicon surface (see Fig. B-8, wherein the top view and the cross section are shown in B-8*a* and B-8*b*, respectively).

Then select a suitable material which has very high thermal conductivity but is an insulator in terms of electrical conductivity (such as Boron-Nitride, BN, which an is electrical insulator but has very high thermal conductivity, such as 600 W/m×K versus 149 W/m×K of Silicon material and can be used to fill the horizontal hallow or tunnel area 603 effectively by CVD process; or use Aluminum-Nitride, AlN, material which has its thermal conductivity as high as 321 W/m×K, or any other suitable Z material 902). Then use a CVD process to fill in the horizontal hallow or tunnel area 603 as created by the aforementioned processing results, for example, BN is selected. Of course, the vacancy inside the STI region 201 is also filled by the BN material or Z material 902 (see Fig. B-9, the top view and the cross section are shown in Fig. B-9*a* and Fig. B-9*b*, respectively). Of course, the suitable material could be Tungsten or other high thermal conductivity metal, as long as it is separate from the silicon body of the transistor by the oxide dielectric layer 901.

Then a CMP technique can be used to take away the BN material or Z material 902 over the Pad-Nitride-1 layer 102 to a planar surface topography, and an anisotropic etching technique is further used to remove some BN material or Z material 902 over the STI region 201. Then deposit a layer of oxide 903 over the surface and level up to the Pad-Nitride-1 layer 102 (see Fig. B-10, the top view and the cross section are shown in Fig. B-10*a* and Fig. B-10*b*, respectively). After removal of the Pad-Nitride-2 layer 301, the silicon surface is covered by Pad-Nitride-1 layer 201 and oxide-covered STI region 201, and the familiar processes can be carried on to complete the MOS transistors in the remaining semiconductor active region 103.

As previously mentioned, the STI regions 201 are spread all over the wafer. With HHDP materials all laid below the body region of MOSFETs/transistors and are connected to all the VHDC BN inside the STI regions 201, this constructed high thermal dissipation materials network can work out as the connected heat-dissipation sink from the operated junctions of transistors. By designing these Z material heat-dissipation sink inside the monolithic die by utilizing the familiar monolithic processing recipe which is all connected to an edge ring of the chip, the BN material or Z material 903 inside STI region 201 can be contacted by opening its top surface so that an entire Die's heat-dissipation sink can be connected to the outside edge of the chip for even more directly and effectively dissipating the heat (e.g. A lead frame can be designed to fulfill this function by directly connecting the BN material or Z material 903 much big areas of Lead-frame materials, or a flip-die connection method can be used to dissipate the heat derived from all the HHDP and HHDC structures proposed in this invention (see Fig. B-11).

Figure B-12 shows another final transistor structure with the HHDP and VHDC microstructures for a new "Cool Transistor (CQT)". Similarly, the transistor in Fig. B-12 could be the same or substantially the same as that in FIG. 11, and therefore the description thereof is omitted. Furthermore, in another embodiment, the processes to form the Horizontal Heat-Dissipation Plate (HHDP) could be skipped and only the Vertical Heat-Dissipation Columns (VHDC) are constructed. Moreover, the VHDC in Fig. B-11 and Fig. B-12 could be made of a single high thermal dissipation material, and could be made of a composite structure as well, as previously mentioned.

Some simulation of 3D cool transistor operation and thermal generation model results have proved such valid points disclosed in our invention (see Fig. B-13), wherein the structure of the 3D transistor is described at the right bottom table of Fig. B-13. When the material of HHDP (corresponding to Region 1 as shown in left figure of Fig. B-13) is BN, and the material of the VHDC (corresponding to "material at STI" shown in the first row of the right top table of Fig. B-13) is BN as well, ΔT (the difference between the p-n junction temperature T_junction and the ambient temperature T_ambient) will be 53 C when T_ambient=40 C. On the other hand, in the event the material of the Region 1 is oxide and the material at STI is also oxide, ΔT will be as high as 121 C when T_ambient=40 C. Thus, the T_junction is dramatically reduced according to the present invention. The right top table of Fig. B-13 also lists different combination of materials (such as, oxide, Si, BN) at Region 1 and at STI and their ΔT results.

Furthermore, the present invention can be applied not only for transistor's heat dissipation, but also for heat dissipation of any circuit device (such as resistors capacitors, diodes, inductors, etc.). Some advantages of this invention HSiD (Heat Sink in Die) and its simulation demonstrations by using 3D modeling tools are described in the following:

(a) The present monolithic die containing a large number of transistors has only heat-dissipation paths through Silicon material, Oxide material and metal interconnection layers all of which have not high thermal conductivities. So the current method is that after either die or packaged chip is completed, then an expensive heat sink by using a metal plate to contact near either the die or the package to achieve some thermal dissipation paths. Afterwards either an expensive liquid cooling method or even an electrical fan system is used to reduce the temperature. These methods are not only added after the monolithic die or chip has been formed (which is not so effective) but also very expensive. This new invention enables a shortest path near the transistor junctions which should be most direct and effective cooling method. The heat sink is formed in the monolithic process which is less expensive than other methods of using other non-monolithic processes by extrinsic materials and additives.

(2) The HHDP and HHDC can be connected together or be formed in-situ by a Z-material. This on-die heat sink is covering almost all entire die area but achieves that transistors can remain as Bulk structure in contrast to SOI structure.

(3) Since the connected Heat Sink Network can be extended to the edges of the die by suitable design methods, the heat-dissipation path can be extended to the external bonding area or lead frame area or other Heterogeneous integration ways to the electronic system environment efficiently. This invention is believed to be fundamental change to all future transistor and die/chip design structures, which are very effective to dissipate thermal power from die to system, (4) As thermal simulation has shown, the transistor junction temperatures can be kept at much lower temperature (e.g. 65 degree C.) than what the present transistor can provide (eg. 105 degree C.). Better PPAC (Performance, Power, Area, Cost) is surely expected with much better results than what can be expected. Therefore it shows higher and closer probability to move toward the TSI era, or some power-hungry applications by using power transistors and more transistors can be projected to be realizable.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A device structure, comprising:
a semiconductor substrate with an original semiconductor surface;
a transistor located within an active region of the semiconductor substrate, wherein the transistor comprises a gate structure, a source region next to one side of the gate structure, and a drain region next to another side of the gate structure, and;
a shallow trench isolation (STI) region surrounding the active region;
a vertical heat dissipation column in the STI region and surrounding the transistor;
wherein the vertical heat dissipation column comprises a thermal dissipation material with a thermal conductivity higher than that of silicon oxide;
wherein a top surface of the vertical heat dissipation column is higher or lower than the original semiconductor surface; and
an insulating layer covering and directly contacting the vertical heat dissipation column, wherein the vertical heat dissipation column is electrically isolated from the source region and the drain region, and a material of the STI region is different from the thermal dissipation material of the vertical heat dissipation column, and a material of the insulating layer is different from the thermal dissipation material of the vertical heat dissipation column.

2. The device structure in claim 1, wherein a top surface of insulating layer is higher than that of the gate structure of the transistor or higher than that of the source region.

3. The device structure in claim 1, wherein the STI region and the insulating layer comprise an oxide, respectively.

4. The device structure in claim 1, wherein the top surface of the vertical heat dissipation column is higher that of the source region.

5. The device structure in claim 1, wherein a top surface of the STI region is higher than the original semiconductor surface.

6. The device structure in claim 5, wherein a contact hole is between the STI region and the gate structure to reveal the source region of the transistor, and a metal plug is within the contact hole and connected to a top surface of the source region.

7. The device structure in claim 6, wherein the metal plug further connects to a most lateral sidewall of the source region.

8. The device structure in claim 1, wherein a top surface of the source region or the drain region of the transistor is higher than the original semiconductor surface.

9. The device structure in claim 1, wherein the drain region of the transistor includes a lightly-doped region laterally extending from a sidewall of the semiconductor substrate and a heavily-doped region laterally extending from the sidewall of the lightly-doped region.

10. The semiconductor circuit structure of claim 9, further comprising a metal contact connected to the top of the drain region.

11. The device structure in claim 1, wherein the transistor is a fin-structured transistor, a planar transistor, a GAA transistor, or a sheet transistor.

12. The device structure in claim 1, wherein the semiconductor substrate comprises an edge remote from the transistor, and the vertical heat dissipation column extends from a position adjacent to the transistor to the edge of the semiconductor substrate.

13. The device structure in claim 12, wherein a heat-dissipation sink is thermally coupled to the vertical heat dissipation column close to the edge of the semiconductor substrate through an opening above the vertical heat dissipation column.

14. The device structure in claim 12, wherein a heat-dissipation substrate is thermally coupled to the vertical heat dissipation column through an opening via penetrating through the substrate from a bottom surface of the substrate to the vertical heat dissipation column.

15. The device structure in claim 1, further comprising another transistor, the semiconductor substrate comprises an edge remote from the transistor and the another transistor, and the vertical heat dissipation column further extends to the edge of the semiconductor substrate.

16. The device structure in claim 15, further comprising:
a first horizontal heat dissipation plate right under the transistor; and
a second horizontal heat dissipation plate right under the another transistor;
wherein the vertical heat dissipation column connected to or thermally coupled to both the first horizontal heat dissipation plate and the second horizontal heat dissipation plate; and
wherein the first horizontal heat dissipation plate and/or the second horizontal heat dissipation plate comprises another thermal dissipation material with another thermal conductivity higher than that of the semiconductor substrate or that of silicon oxide.

17. The device structure in claim 16, wherein the thermal dissipation material and/or the another thermal dissipation material is BN, AlN or metal.

18. The device structure in claim 16, wherein:
the first horizontal heat dissipation plate is connected to or thermally coupled to bottom surfaces of a drain region and a source region of the first transistor, and the first horizontal heat dissipation plate is connected to the vertical heat dissipation column; and
the second horizontal heat dissipation plate is connected to or thermally coupled to bottom surfaces of a drain region and a source region of the another transistor, and the second horizontal heat dissipation plate is connected to the vertical heat dissipation column.

19. The device structure in claim 1, wherein the vertical heat dissipation column is between the insulating layer and the STI region.

20. The device structure in claim 1, wherein a top surface of the STI region is higher than the original semiconductor surface; wherein a concave is formed between the STI region and a gate structure of the transistor, and a metal plug is formed within the concave and contacted to the top of the drain region or the source region of the first transistor.

21. The device structure in claim 16, wherein the first horizontal heat dissipation plate and/or the second horizontal heat dissipation plate further comprises a thin oxide layer covering the another thermal dissipation material.

* * * * *